United States Patent

Kita

[11] Patent Number: 5,618,745
[45] Date of Patent: Apr. 8, 1997

[54] METHOD OF MANUFACTURING A ONE TRANSISTOR ONE-CAPACITOR MEMORY CELL STRUCTURE WITH A TRENCH CONTAINING A CONDUCTOR PENETRATING A BURIED INSULATING FILM

[75] Inventor: Akio Kita, Tokyo, Japan

[73] Assignee: Oki Electric Industry Co., Ltd., Tokyo, Japan

[21] Appl. No.: 366,505

[22] Filed: Dec. 30, 1994

Related U.S. Application Data

[62] Division of Ser. No. 156,620, Nov. 23, 1993, Pat. No. 5,442,211.

[30] Foreign Application Priority Data

Dec. 1, 1992 [JP] Japan .................................... 4-321644

[51] Int. Cl.⁶ .......................... H01L 21/70; H01L 27/00
[52] U.S. Cl. ........................ 438/164; 438/243; 438/459; 438/386; 438/155
[58] Field of Search ............................. 437/47, 52, 60, 437/919, 203; 257/301–303, 306

[56] References Cited

U.S. PATENT DOCUMENTS

| | | | |
|---|---|---|---|
| 4,953,125 | 8/1990 | Okumura et al. | 257/304 |
| 5,119,155 | 6/1992 | Hieda et al. | 257/304 |
| 5,170,372 | 12/1992 | Wong | 257/304 |
| 5,302,542 | 4/1994 | Kishi et al. | 437/52 |

FOREIGN PATENT DOCUMENTS

| | | | |
|---|---|---|---|
| 63-179567 | 7/1988 | Japan | 437/52 |
| 63-219154 | 9/1988 | Japan | 257/68 |

OTHER PUBLICATIONS

M. Sakamoto et al, "Buried Storage Electrode (BSE) Cell for Megabit Drams", IEDM 85, 1985, IEEE at pp. 710–713.

*Primary Examiner*—Jey Tsai
*Attorney, Agent, or Firm*—Law Office of Steven M. Rabin

[57] ABSTRACT

A method of manufacturing a one-transistor one-capacitor memory cell structure. In a first step, a buried insulating film layer is formed in a semiconductor substrate and a semiconductor layer is formed on the buried insulating film layer. In a second step, a capacitor trench is formed in the substrate by penetrating through the buried layer and a dielectric film layer is formed on an inner side wall surface of the trench. Then, a conductive material is filled into the trench to form a capacitor. Finally, an MIS transistor is formed in the semiconductor layer adjacent to the trench capacitor such that either the drain or the source makes contact with the conductive material.

17 Claims, 5 Drawing Sheets

METHOD OF MANUFACTURING A ONE TRANSISTOR ONE-CAPACITOR MEMORY CELL STRUCTURE WITH A TRENCH CONTAINING A CONDUCTOR PENETRATING A BURIED INSULATING FILM

CROSS-REFERENCE TO RELATED APPLICATIONS

This is a division of U.S. patent application Ser. No. 08/156,620, filed Nov. 23, 1993 (now U.S. Pat. No. 5,442,211, issued Aug. 15, 1995).

BACKGROUND OF THE INVENTION

1. Field of the Invention

The present invention relates to a cell structure for a Metal Insulator Semiconductor Dynamic Random Access Memory (hereinafter simply abbreviated as MIS DRAM) constructed of a combination of one transistor and one capacitor and also to a method for manufacturing the same.

2. Related Art

A conventional memory cell structure for DRAMs is disclosed, for example, in Japanese Laid-open Patent Publication Number 60-225462. FIG. 1 shows such a conventional memory structure utilizing a trench.

A capacitor 20 is constituted by a capacitor electrode 5, a dielectric film 6 and a plate electrode 7, all of which are contained in a trench 2 formed in a silicon substrate 1. The capacitor 20 is electrically isolated from the substrate 1 by forming an oxide film 3 therebetween. Adjacent to the capacitor is formed a switching transistor 30 comprising diffusion layers 10, 11, a gate oxide film 8 and a gate electrode 9. The capacitor electrode 5 is electrically connected to the diffusion layer 10 of the switching transistor 30 at a contact region 4.

An inter-layer insulating film 12 is formed to coat the entire surface of the above constructed structure and a contact hole 13 is opened at a prescribed position for interconnection. A bit line 14 is formed on the inter-layer insulating film 12 so as to be connected through a contact hole 13 to the other diffusion layer 11. The gate electrode 9 of the switching transistor 30 extends in a direction vertical to the sectional view of the paper and constitutes a word line. A passivation film 15 is finally formed to coat the entire structure.

Another conventional cell structure has been proposed entitled as "BURIED STORAGE ELECTRODE (BSE) CELL FOR MEGABIT DRAMS" at pp 710–713, IEDM 85, 1985, IEEE.

The BSE cell is featured with a trench capacitor, similar to the other vertically structured memory cell described above so far, but differs from it in that the plate electrode is in the substrate whereas the charge storage electrode is in the buried polysilicon which has been refilled into the capacitor trench. The buried polysilicon is connected to the diffusion region of the switching transistor just adjacent to the capacitor trench. Most portions of the capacitor trench penetrate deep into the $p^{++}$ substrate. Key steps of BSE cell fabrication are described as follows:

(a) The shallow trench for isolation, filled with an insulating material, is formed within the p-type epitaxial layer in the isolation region. Then, deep trenches for the capacitor are dug down into the $p^{++}$ substrate by means of reactive ion etching.

(b) A capacitor dielectric film is formed on the trench surface. Then, the trench is filled with conductive polysilicon. The polysilicon deposited outside of the trench is etched away through an etch-back process for planarization.

(c) After opening windows in the dielectric film just adjacent to the capacitor trench for $n^+$ contact region formation, a polysilicon film is deposited. Then, phosphorus diffusion follows to dope the polysilicon and to diffuse phosphorus simultaneously into the epitaxial layer to form the $n^+$ contact region. The buried polysilicon in the trench is electrically connected to the $n^+$ contact region which is connected in turn to a contact electrode of the switching transistor. The polysilicon is then delineated using reactive ion etching and oxidized on its surface layer.

(d) The switching transistor formation and aluminum metalization are performed by using conventional process steps to form word lines and bit lines.

Among the above described conventional structures, the former one has the following shortcomings.

(1) The effective inner surface area of the trench, which can be utilized as a capacitor, decreases because the oxide for isolation and the capacitor electrodes are all formed in the trench. For example, the effective inner width of the trench becomes 0.2 µm if the oxide and the capacitor electrode are 100 nm, respectively, in thickness even though the trench hole has a width of 0.6 µm. Accordingly, a sufficient amount of capacitance cannot be achieved when one attempts to shrink the cell.

(2) The contact region, which is disposed horizontally on the surface of the substrate between the trench capacitor and the switching transistor, may restrict further scale shrinkage. In addition, it is required to have some allowance between the contact region and the gate electrode, which also causes further restriction of the scale shrinkage.

(3) A leakage current may be generated between the capacitor electrode and the silicon substrate due to a parasitic MOS structure constructed at the side wall of the trench, thereby destroying information stored in the memory cell. Although the latter described conventional structure can overcome the above mentioned three shortcomings, there still remain the following shortcomings.

Since the MIS transistor is formed in the epitaxial $p^+$ layer on the heavily doped $p^{++}$ substrate, depletion layer extension from the diffusion layers, i.e., the drain and source regions, is still thick and there cannot be accomplished a complete depletion type MIS transistor which improves sub-threshold characteristics remarkably and reveals better off-characteristics with a low threshold voltage.

SUMMARY OF THE INVENTION

Accordingly, it is an object of the present invention to provide an improved one-transistor one-capacitor memory cell DRAMs to solve the above shortcomings.

Another object of the present invention is to provide a one-transistor one-capacitor memory cell structure for DRAMs suitable for scale shrinkage.

A further object of the present invention is to provide an improved capacitor structure suitable for one-transistor one-capacitor memory cell DRAMs.

A still further object of the present invention is to provide a method for manufacturing the above-mentioned structures.

To accomplish the above objects, there is provided a one-transistor one-capacitor memory cell having: (a) a semiconductor substrate, a surface of which being successively covered by a buried insulating film layer and a single crystalline semiconductor film layer; (b) an insulating layer for isolation formed at a predetermined region of the single crystalline semiconductor film layer in such a manner that a depth thereof reaches to the buried insulating film layer; (c) a trench penetrating through the buried insulating film layer along a side wall of the insulating layer for isolation from the single crystalline semiconductor film layer and reaching to a predetermined depth of the substrate; (d) a dielectric film layer formed on an inner side wall surface of the trench except for a top portion thereof; (e) a conductive material filled in the trench up to a top edge of the dielectric film layer; (f) a conductor plug filled in the trench from the top edge of the dielectric film layer up to a top of the trench; and (g) a MIS transistor having a source diffusion layer and a drain diffusion layer formed in the single crystalline semiconductor film layer; i) the source diffusion layer and the drain diffusion layer reaching to the buried insulating film layer; ii) either the source diffusion layer or the drain diffusion layer making contact with the conductor plug; whereby is formed a capacitor, a plate electrode and a storage node electrode which are respectively formed by the semiconductor substrate and the conductive material, and a memory cell is formed by connecting the capacitor to the MIS transistor through the conductor plug.

There is also provided a method for manufacturing a one-transistor one-capacitor memory cell having the steps of: (a) forming a buried insulating film layer in a semiconductor substrate; (b) forming a semiconductor thin film layer on the buried insulating film layer; (c) forming a trench in the semiconductor substrate by penetrating through the buried insulating film layer; (d) forming a dielectric film layer for a capacitor on an inner side wall surface of the trench; (e) filling a conductive material into the trench; and (f) forming a MIS transistor having a drain and a source in the semiconductor thin film layer in such a manner that either the drain or the source makes contact with the conductive material.

Since a very narrow, relatively shallow insulating layer for isolation has been provided between the neighboring capacitor trenches, there is little possibility of current leakage between the neighboring capacitor trenches even when a relatively high voltage is applied across the capacitor, thereby enabling high density integration. The storage electrode is formed inside the trench so that electric charges, generated by incoming alpha-particles toward the substrate, do not flow through the storage electrode, which improves the immunity against soft errors.

The cell structure according to the invention also eliminates the conductive layer which has been necessary as a cell plate electrode in the conventional structure so that simplification of the manufacturing steps and high density integration can be easily accomplished.

BRIEF DESCRIPTION OF THE DRAWINGS

By way of example and to make the description more clear, reference is made to the accompanying drawings in which.

DETAILED DESCRIPTION OF THE PREFERRED EMBODIMENTS

Figure 1:
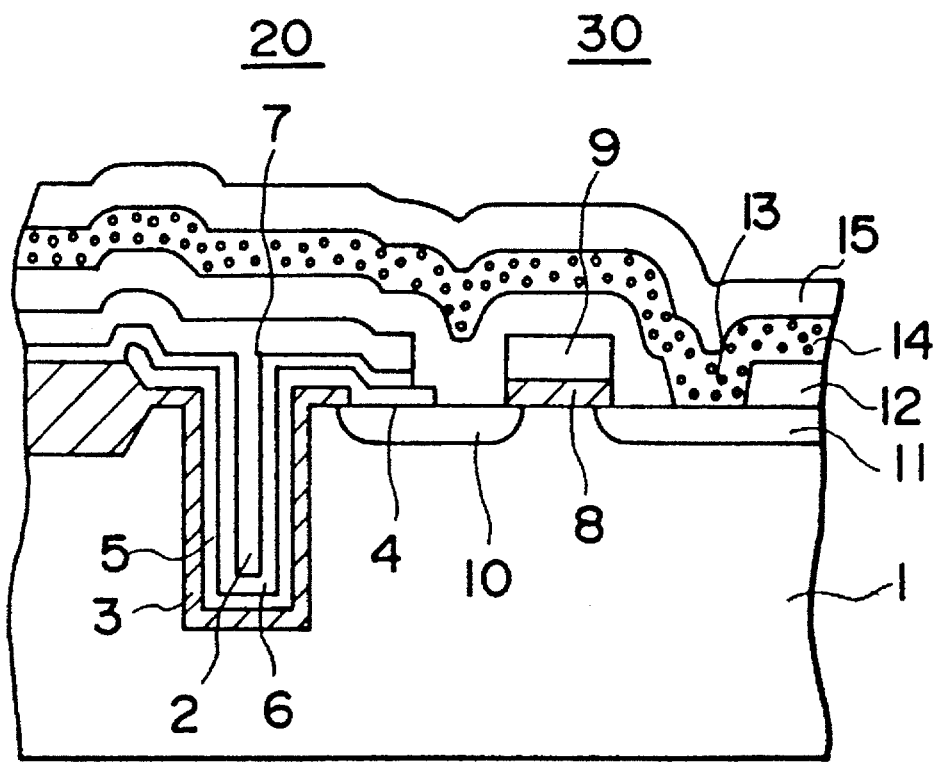
FIG. 1 is a cross sectional view illustrating a conventional cell structure for a DRAM.
Figure 2:
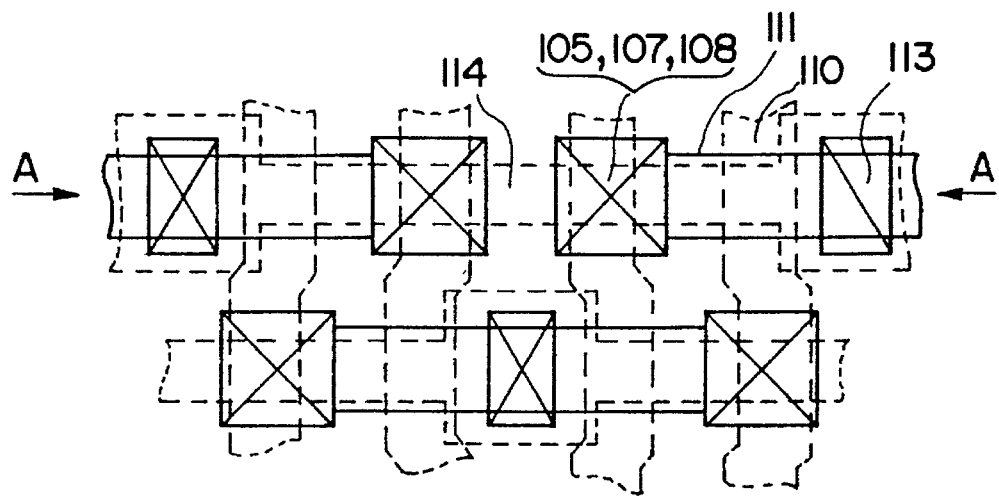
FIG. 2 is a top plan view illustrating a cell structure embodying the present invention.
Figure 3:
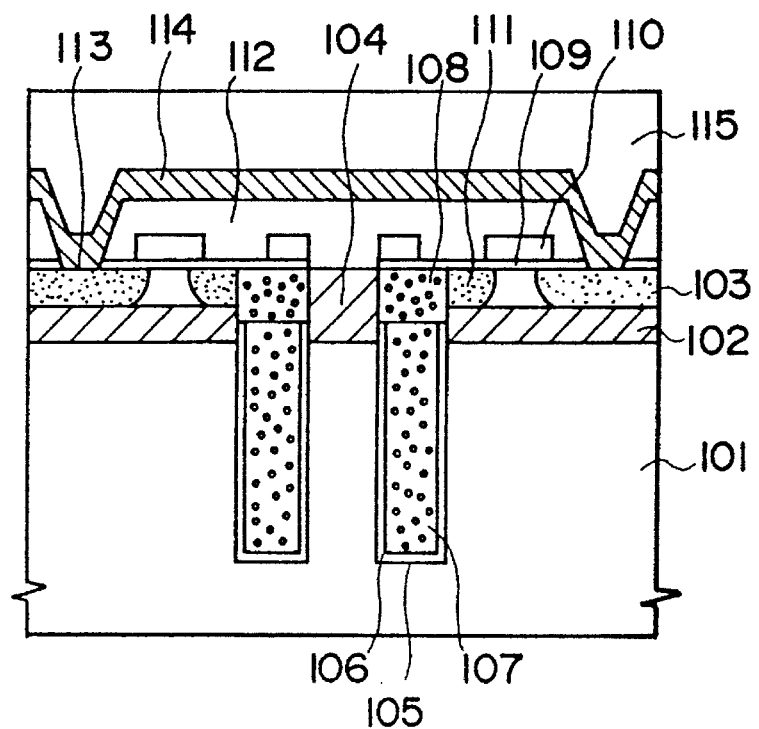
FIG. 3 is a cross sectional view taken on the plane of the line A—A of FIG. 2.

Referring now in detail to FIGS. 2 and 3, a high concentration N type single crystalline substrate 101 having approximately 0.01 $\Omega \cdot cm$ in specific resistance is prepared as a semiconductor substrate. Then, a buried oxide film 102 and a low concentration P type single crystalline thin film layer 103 are successively formed on the surface of the substrate 101. Deep capacitor trenches 105 are dug down into the substrate 101 penetrating through the layer 103 and the buried oxide film 102. A capacitor dielectric thin film 106 is formed on the inner wall surface of the trench 105.

The trench 105 is filled with conductive polysilicon to form a storage node electrode 107. The substrate 101 serves as a plate electrode of a capacitor 20a and a constant voltage which is approximately half of the bit line amplitude voltage is applied to it. Adjacent to the capacitor 20a, a switching MIS transistor 30a, which is constituted by a gate oxide film 109, a gate electrode 110 and an $N^+$ diffusion layer 111, is formed in the thin film layer 103.

One side of the $N^+$ diffusion layer 111 is connected to the storage node electrode 107 through a conductive plug 108 which is formed by filling the upper portion of the trench 105 with a conductive material similar to the storage node electrode 107, such as a high concentration polycrystalline silicon.

Another side of the $N^+$ diffusion layer 111 is connected to a bit line 114 through a hole 113 which is formed by opening a window at a predetermined region of an inter layer insulating layer 112 covering the entire structure.

A very narrow and relatively shallow isolation oxide film 104 is provided between the neighboring trench capacitors 20a. The top surface of the entire structure is covered with a passivation film 115. The gate electrode 110 of the MIS transistor 30a, which extends over the other cells located in a direction vertical to the cross-sectional view of FIG. 2, forms a word line concurrently.

When one of the word lines is selected by a decoder which is located peripherally to a memory cell array, the selected word line turns to a high level so as to make the MIS transistor 30a conductive, thereby writing information on the bit line into the capacitor 20a or reading information on the capacitor 20a out to the bit line.

When the word line is not selected, the word line is kept at a low level so as to make the MIS transistor 30a non-conductive, thereby preserving the information on the capacitor 20a.

Figure 4:
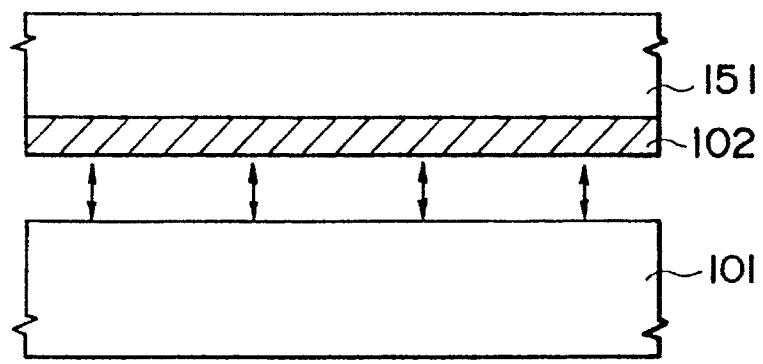
FIGS. 4(a)–4(c) are cross sectional views illustrating the first successive manufacturing steps of the cell structure embodying the present invention.
Figure 4:
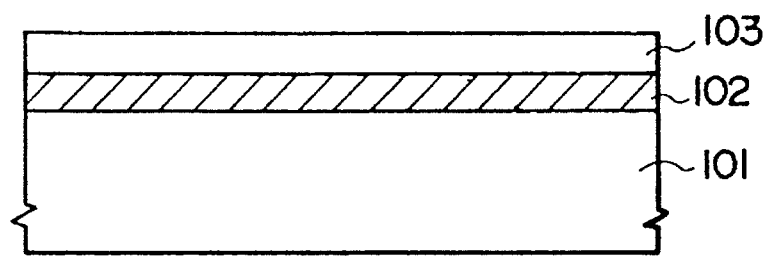
Figure 4:
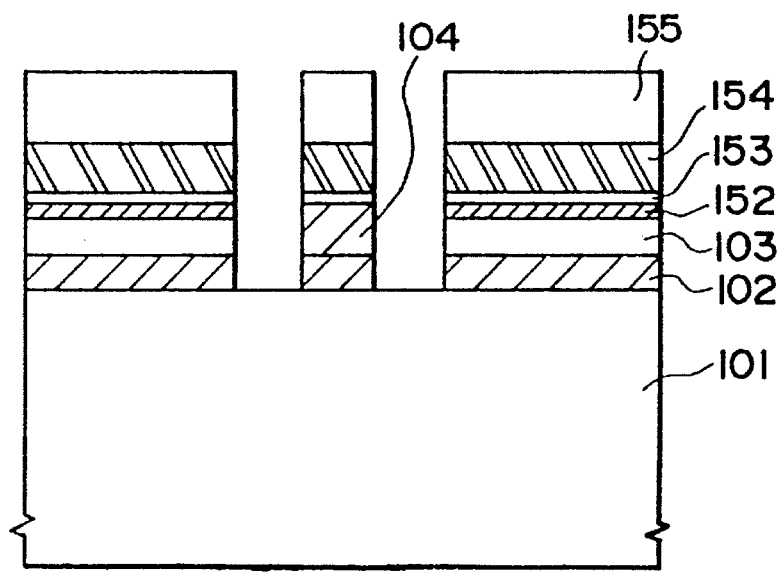
Figure 5:
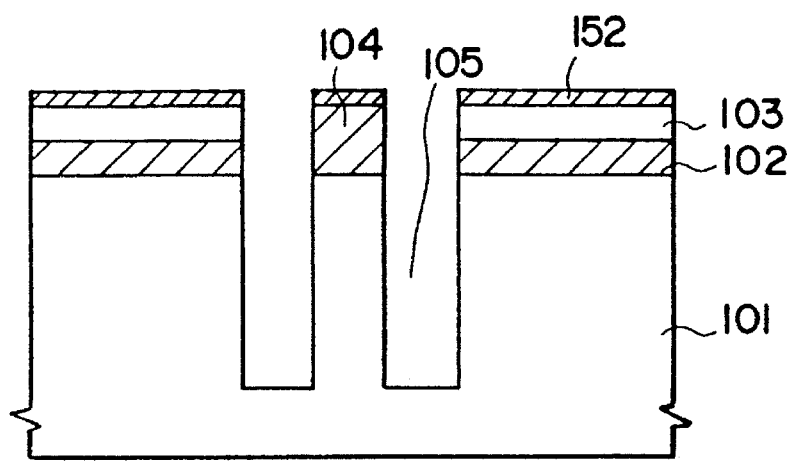
FIGS. 5(a)–5(c) are cross sectional views illustrating the second successive manufacturing steps of the cell structure embodying the present invention.
Figure 5:
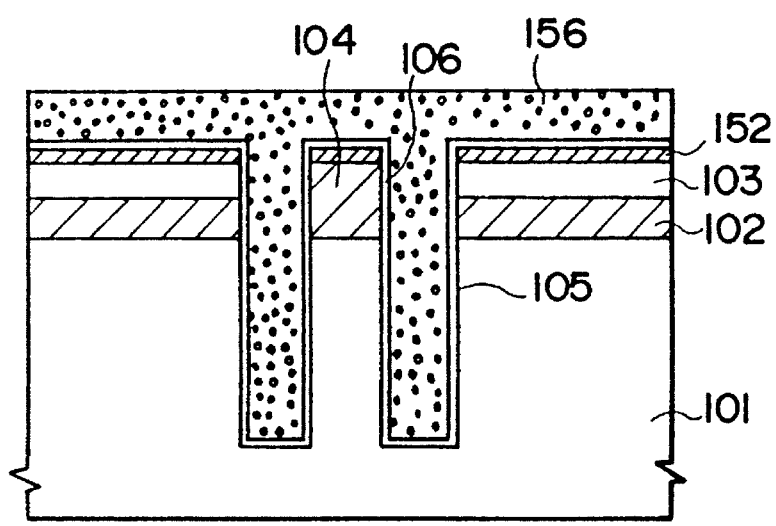
Figure 5:
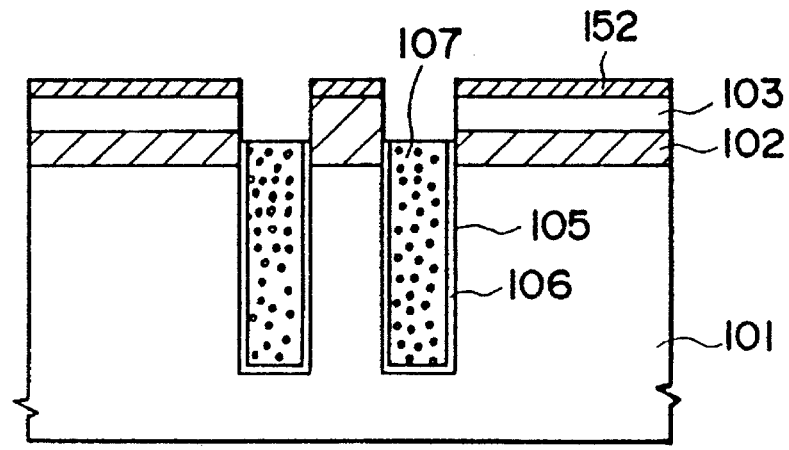
Figure 6:
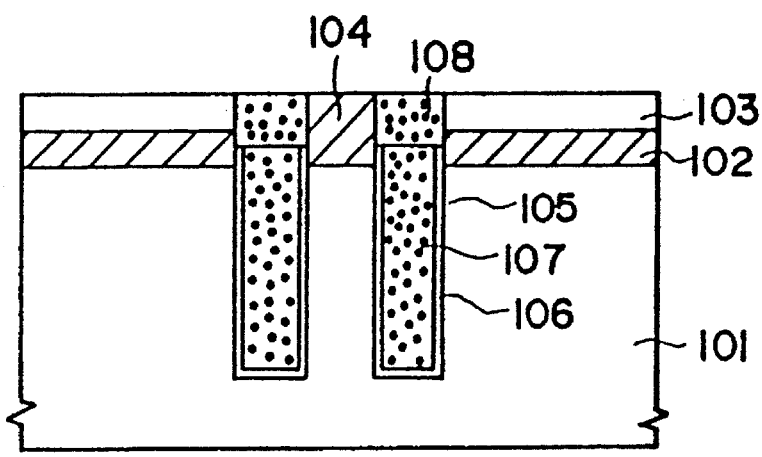
FIGS. 6(a)–6(c) are cross sectional views illustrating the third successive manufacturing steps of the cell structure embodying the present invention.
Figure 6:
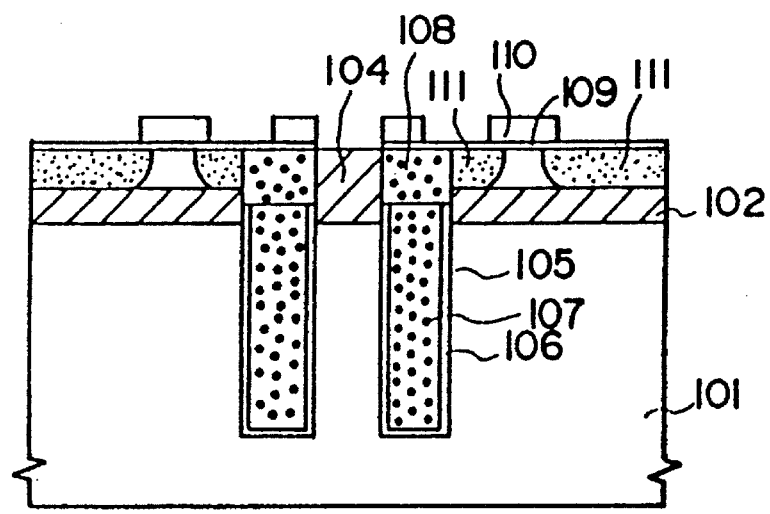
Figure 6:
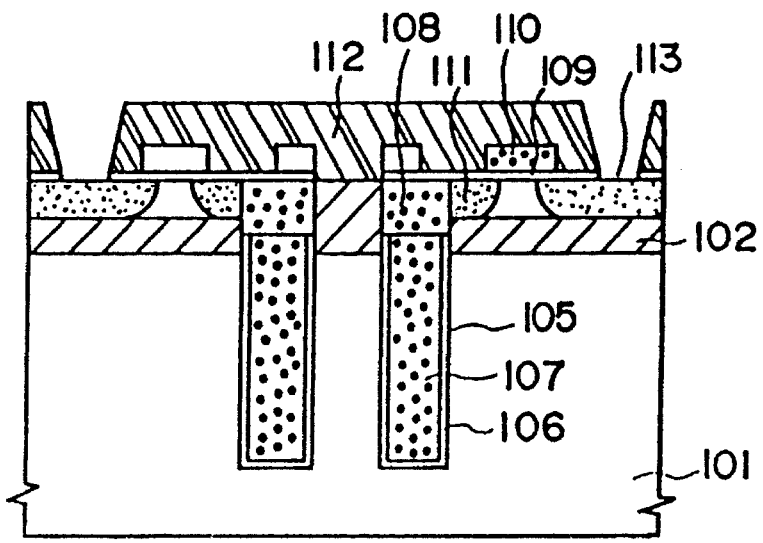

Now, referring to FIGS. 4–6, a method for manufacturing the one-transistor one-capacitor memory cell described above as one of the preferred embodiments will be described.

First, as shown in FIG. 4(a), a P type (100) axis oriented single crystalline silicon member 151 having approximately $5\times10^{14}$ cm$^{-3}$ in impurity concentration is prepared and is thermally oxidized to grow a thermal oxide film 102 approximately 500 nm thick on its surface. A mirror polished N type single crystalline silicon substrate 101 having approximately 0.01 Ω·cm in specific resistance is separately prepared and is affixed to the single crystalline silicon member 151 with the oxide film 102 located therebetween. An annealing process is employed at a temperature of approximately 1100° C. to securely adhere the substrate 101 and the member 151 to each other with van-der-Waals force.

Next, as shown in FIG. 4(b), the single crystalline silicon member 151 is polished off by applying mechanical grinding from its rear surface to obtain a low concentration P type single crystalline thin film layer 103 having a thickness of approximately 250 nm, the concentration being higher than that of the semiconductor substrate 101.

Next, an isolation oxide film 104 is formed at a predetermined region on the surface of the layer 103 by applying a selective oxidation process.

Next, an oxide film 152, a silicon nitride film 153 and an oxide film 154, being 50 nm, 20 nm and 500 nm thick, respectively, are successively formed on the layer 103 and the oxide film 104. A photo resist 155 is finally applied on the surface of the oxide film 154 and patterned with a conventional photolithographic technique.

Then, as shown in FIG. 4(c), a dry etching process is applied, with the patterned photo resist 155 being used as a mask, to successively etch off respective exposed regions of the oxide film 154, the silicon nitride film 153, the oxide film 152, the low concentration P type single crystalline thin film layer 103 and the oxide film 102.

Next, a trench 105 is formed into the substrate 101 by using the oxide film 154 as a mask, after the patterned photo resist 155 is removed. The depth of the trench 105 is determined by the peripheral length of the trench hole, the dielectric constant and layer thickness of the capacitor dielectric, and the necessary capacitance.

In this embodiment, the trench, which may be applied to a 256M bit DRAM that employs capacitors needing 25 fF in capacitance, becomes approximately 4 μm deep when the trench width is 0.3 μm and a 5 nm thick silicon nitride layer is used as the dielectric, if measured by being converted into silicon oxide thickness (i.e., the thickness if a silicon oxide dielectric were used instead of silicon nitride to achieve the designated capacitance). After forming the trench 105, as shown in FIG. 5(a), the oxide film 154, which was used as a mask, is removed in such a manner that the silicon nitride film 153 serves as a stopper film. Further, the silicon nitride film 153 itself is also removed when it becomes unnecessary, having served its purpose as a stopper film.

Then, as shown in FIG. 5(b), a silicon nitride film is deposited as a capacitor dielectric film 106 on the entire surface, including the inner wall surface of the trench 105, of the structure by applying a CVD process. Then, the trench hole 105 is completely refilled with highly doped phosphorous-containing polycrystalline silicon 156.

Next, as shown in FIG. 5(c), the polysilicon 156 deposited outside of the trench 105 is etched away through an etchback process for planarization so that the polysilicon 156 remains only inside of the trench 105 and serves as a storage electrode 107. In this step, the oxide film 152 serves as a stopper film for etching. The silicon nitride film 106 is also etched off but remains on the inner wall surface of the trench 105 where the storage electrode 107 is formed. This etchback process must be controlled so that the top surface of the storage electrode 107 is maintained at a level along the thickness of the oxide film 102.

Then, polycrystalline silicon 108 is deposited on the entire surface of the structure and is also etched back in the same way described above to fill the remaining upper portion of the trench 105 so that the storage electrode 107 and the low concentration P type single crystalline thin film layer 103 are connected to each other through the polycrystalline silicon 108. The polycrystalline silicon 108 thus formed serves as a plug.

Next, as shown in FIG. 6(a), the oxide film 152, which is now unnecessary as a stopper, is removed. The capacitor 20a shown in FIG. 3 is now completed in a form such that the whole structure is completely buried in the trench.

Then, as shown in FIG. 6(b), a switching transistor is formed, adjacent to the trench capacitor, in the thin film layer 103 as follows.

A gate oxide film 109 approximately 10 nm thick is grown by a thermal oxidation process on the entire body, phosphorous doped high concentration polycrystalline silicon is deposited on the gate oxide film 109 and the polycrystalline silicon is patterned to form a gate electrode 110.

Then, arsenic ions are implanted into the entire surface of the body, with the gate electrode 110 serving as a mask, to form an N$^+$ diffusion layer 111. After annealing of the implanted impurity, the diffusion layer 111 extends to the buried silicon oxide film 102. This provides source and drain impurity regions.

Next, as shown in FIG. 6(c), a boro-phospho-silicate glass (BPSG) film is deposited, reflown and planarized as an inter layer insulating film 112 on the entire surface of the body. Then, a contact hole 113 is formed in the inter layer insulating film 112 to interconnect the diffusion layer 111 to a bit line.

Hereinafter, although the process steps are not illustrated, the bit line is formed with polycide or the like and the main processes for manufacturing the memory cell will be finished. A metal wiring process using aluminum will be added, if necessary, and a passivation film will be finally applied to cover the entire structure.

As many apparently widely different embodiments of the present invention may be made without departing from the spirit and scope thereof, it is to be understood that the invention is not limited to the specific embodiments thereof except as defined in the appended claims.

What is claimed is:

1. A method for manufacturing a one-transistor, one-capacitor memory cell, comprising the steps of:

(a) forming a buried insulating film layer on a semiconductor substrate;

(b) forming a semiconductor layer on the buried insulating film layer;

(c) forming a trench in the semiconductor substrate by etching through the buried insulating film layer;

(d) forming a dielectric film layer for a capacitor directly contacting an inner side wall surface of a lower portion of the trench;

(e) filling a conductive material into the trench from a bottom of the trench up to a top edge of said dielectric film layer;

(f) forming a conductive plug in an upper portion of the trench, from the top edge of the dielectric film layer, in contact with the conductive material, up to a top edge of said trench; and (g) forming a MIS transistor, having drain and source impurity regions, in the semiconductor layer in such a manner that one of the impurity regions makes contact with the conductive plug.

2. A method for manufacturing the one-transistor, one-capacitor memory cell set forth in claim 1, wherein the steps (a) and (b) are performed in such a manner that two semiconductor substrates, a surface of at least one of which is covered by the insulating film layer, are securely affixed to each other by holding the insulating film layer therebetween and that either one of the semiconductor substrates is polished so as to make the semiconductor layer.

3. A method for manufacturing the one-transistor, one-capacitor memory cell set forth in claim 2, wherein a conductivity type of each of the two semiconductor substrates is different.

4. A method for manufacturing the one-transistor, one-capacitor memory cell set forth in claim 1, wherein the semiconductor layer is higher in doping concentration than the semiconductor substrate.

5. A method for manufacturing the one-transistor, one-capacitor memory cell set forth in claim 1, wherein an impurity concentration of the semiconductor layer is set below $10^{16}$ cm$^{-3}$.

6. A method for manufacturing the one-transistor, one-capacitor memory cell set forth in claim 1, wherein the drain and the source impurity regions extend to the buried insulating film layer.

7. A method for manufacturing a one-transistor, one-capacitor memory cell,, comprising the steps of:
   (a) forming an insulating film layer on a semiconductor substrate;
   (b) forming a semiconductor layer on the insulating film layer;
   (c) forming a trench in the semiconductor substrate, the insulating film layer, and the semiconductor layer;
   (d) forming a dielectric film layer for a capacitor directly on an inner side wall surface of a lower portion of the trench;
   (e) filling a conductive material into the trench from a bottom of the trench up to a level along a thickness of said insulating film layer; and
   (f) forming a conductive plug in an upper portion of the trench, in contact with the conductive material; and
   (g) forming a transistor having a diffusion layer in the semiconductor layer in contact with the conductive plug.

8. A method for manufacturing the one-transistor one-capacitor memory cell set forth in claim 7, wherein the steps (a) and (b) include the steps of forming two semiconductor substrates, a surface of at least one of which is covered by the insulating film layer; affixing the insulating film layer between the semiconductor substrates; and polishing one of the semiconductor substrates to form the semiconductor layer.

9. A method for manufacturing the one-transistor, one-capacitor memory cell set forth in claim 8, wherein a conductivity type of each of the two semiconductor substrates is different.

10. A method for manufacturing the one-transistor, one-capacitor memory cell set forth in claim 7, wherein the semiconductor layer is higher in doping concentration than the semiconductor substrate.

11. A method for manufacturing the one-transistor, one-capacitor memory cell set forth in claim 7, wherein an impurity concentration of the semiconductor layer is set below $10^{16}$ cm$^{-3}$.

12. A method for manufacturing the one-transistor, one-capacitor memory cell set forth in claim 7, wherein the diffusion layer extends to the insulating film layer.

13. A method for manufacturing a capacitor, comprising the steps of:
   (a) forming an insulating film layer on a semiconductor substrate;
   (b) forming a semiconductor thin film layer on the insulating film layer;
   (c) forming a trench in the semiconductor substrate, the insulating film layer, and the semiconductor layer;
   (d) forming a dielectric film layer for a capacitor directly on an inner side wall surface of a lower portion of the trench;
   (e) filling a conductive material into the trench from a bottom of the trench up to a level along a thickness of said insulating film layer;
   (f) forming a conductive plug in an upper portion of the trench, from a top edge of the dielectric film layer, in contact with the conductive material; and
   (g) forming a transistor having a diffusion layer, in the semiconductor thin film layer in contact with the conductive plug.

14. A method for manufacturing a capacitor set forth in claim 13, wherein the steps (a) and (b) include the steps of forming two semiconductor substrates, a surface of at least one of which is covered by the insulating film layer; affixing the insulating film layer between the semiconductor substrates; and polishing one of the semiconductor substrates to form the semiconductor thin film layer.

15. A method for manufacturing a capacitor set forth in claim 14, wherein a conductivity type of each of the two semiconductor substrates is different.

16. A method for manufacturing a capacitor set forth in claim 13, wherein the semiconductor thin film layer is higher in doping concentration than the semiconductor substrate.

17. A method for manufacturing a capacitor set forth in claim 13, wherein an impurity concentration of the semiconductor thin film layer is set below $10^{16}$ cm$^{-3}$.

* * * * *